United States Patent
Lu et al.

(10) Patent No.: US 7,144,828 B2
(45) Date of Patent: Dec. 5, 2006

(54) HE TREATMENT TO IMPROVE LOW-K ADHESION PROPERTY

(75) Inventors: Wei Lu, Singapore (SG); Luona Goh Loh Nah, Singapore (SG); John Sudijono, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/768,918

(22) Filed: Jan. 30, 2004

(65) Prior Publication Data

US 2005/0170663 A1  Aug. 4, 2005

(51) Int. Cl.
- *H01L 21/42* (2006.01)
- *H01L 21/324* (2006.01)
- *H01L 21/477* (2006.01)

(52) U.S. Cl. ..................... 438/778; 438/623
(58) Field of Classification Search ............... 438/623, 438/626, 758, 778, 780, 787, 789, 798
See application file for complete search history.

(56) References Cited

U.S. PATENT DOCUMENTS

| | | | |
|---|---|---|---|
| 5,998,229 A | 12/1999 | Lyu et al. ................ 438/30 |
| 6,143,670 A * | 11/2000 | Cheng et al. ............ 438/780 |
| 6,346,489 B1 | 2/2002 | Cohen et al. ............ 438/789 |
| 6,410,426 B1 * | 6/2002 | Xing et al. .............. 438/638 |
| 6,465,372 B1 | 10/2002 | Xia et al. ................ 438/787 |
| 6,498,112 B1 * | 12/2002 | Martin et al. ........... 438/763 |
| 6,566,283 B1 * | 5/2003 | Pangrle et al. .......... 438/788 |
| 6,570,256 B1 | 5/2003 | Conti et al. ............. 257/761 |
| 6,690,091 B1 * | 2/2004 | Chooi et al. ............ 257/758 |
| 6,740,416 B1 * | 5/2004 | Yokogawa et al. ...... 428/446 |
| 6,936,309 B1 * | 8/2005 | Li et al. .................. 427/535 |
| 2005/0074695 A1 * | 4/2005 | Nakamura et al. ...... 430/271.1 |

* cited by examiner

*Primary Examiner*—Phuc T. Dang

(57) ABSTRACT

A method of improving adhesion of low dielectric constant films to other dielectric films is described. A low dielectric constant material layer is deposited on a substrate. The low dielectric constant material layer is treated with helium plasma. An overlying layer is deposited on the low dielectric constant material layer wherein there is good adhesion between the low dielectric constant material layer and the overlying layer.

22 Claims, 3 Drawing Sheets

HE TREATMENT TO IMPROVE LOW-K ADHESION PROPERTY

BACKGROUND OF THE INVENTION (1) Field of the Invention

The invention relates to the use of low dielectric constant materials in the fabrication of integrated circuits, and more particularly, to a method of improving adhesion of low dielectric constant materials to overlying materials in the manufacture of integrated circuits.

(2) Description of the Prior Art

Low dielectric constant materials, having a dielectric constant (k) of less than about 3.1, are preferably used in the fabrication of integrated circuits to reduce capacitance. An integration challenge facing processes incorporating low dielectric constant materials is the adhesion of these low dielectric constant materials to overlying layers. Poor adhesion is a cause for reliability concerns. A plasma treatment can be used on a low-k dielectric material layer to improve its adhesion property. It is necessary to prevent or minimize damage to the low-k material caused by the plasma treatment.

U.S. Pat. No. 6,346,489 to Cohen et al discloses a method to remove native oxide within a via opening by treating the substrate with a hydrogen-helium plasma. Cohen et al reveal that this treatment does not adversely effect the dielectric constant of a low-k layer through which the opening is made and also that the treatment improves damage made to the low-k layer by oxygen ashing. No mention is made of adhesion concerns of the low-k layer. U.S. Pat. No. 5,998,229 to Lyu et al describes repairing etching damage to an amorphous silicon layer by using a hydrogen or helium plasma treatment. U.S. Pat. No. 6,570,256 to Conti et al shows a method of forming a carbon-graded layer for improving adhesion of low-k dielectrics to the underlying substrate. A helium and/or oxygen treatment is disclosed as an additional or alternative treatment of the substrate to improve adhesion of the substrate. U.S. Pat. No. 6,465,372 to Xia et al includes densification of a low-k film using a plasma treatment. This has nothing to do with adhesion. Furthermore, this patent teaches adhesion enhancement by treating the film in a reducing environment of ammonia.

SUMMARY OF THE INVENTION

A principal object of the present invention is to provide an effective and very manufacturable method of improving adhesion of dielectric films to overlying layers in the fabrication of integrated circuit devices.

Another object of the invention is to provide a method of improving adhesion of low dielectric constant material dielectric films to overlyling layers.

Yet another object of the invention is to provide a method of improving adhesion of low dielectric constant films to other dielectric films by treating the low dielectric constant films using a helium plasma.

In accordance with the objects of this invention a method of improving adhesion of low dielectric constant films to other dielectric films is achieved. A low dielectric constant material layer is deposited on a substrate. The low dielectric constant material layer is treated with helium plasma. An overlying layer is deposited on the low dielectric constant material layer wherein there is good adhesion between the low dielectric constant material layer and the overlying layer.

BRIEF DESCRIPTION OF THE DRAWINGS

In the accompanying drawings forming a material part of this description, there is shown.

DESCRIPTION OF THE PREFERRED EMBODIMENTS

Figure 1:
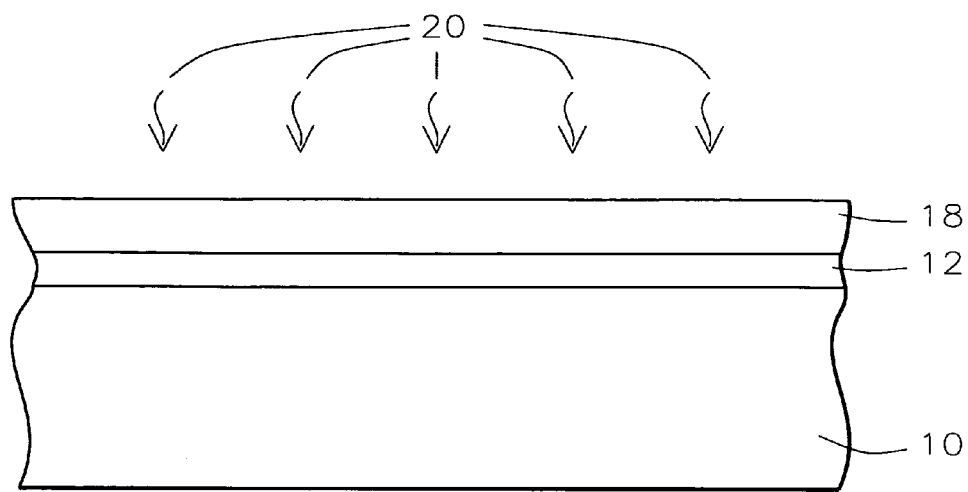
FIGS. 1 through 5 schematically illustrate in cross-sectional representation a preferred embodiment of the present invention.

The present invention proposes a method of improving adhesion of low dielectric constant films to other dielectric films. It will be understood by those skilled in the art that the present invention should not be limited to the application illustrated in the drawings, but can be extended and applied to any application in which improved adhesion of dielectric films to overlying layers is desired.

Referring now more particularly to FIG. 1, there is illustrated a portion of a partially completed integrated circuit device. There is shown a substrate 10, preferably composed of monocrystalline silicon. Device structures, such as gate electrodes, source and drain regions, and metal interconnects, not shown, are formed in and on the substrate and covered with an insulating layer. A passivation or barrier layer 12 may be formed over the device structures to a thickness of between about 250 and 600 Angstroms. For example, a silicon carbide layer may be used.

A first low dielectric constant (k) material layer 18 is deposited over the passivation layer 12 to a thickness of between about 12000 and 8000 Angstroms. The first low dielectric constant material has a dielectric constant lower than 3.1 and preferably, about 2.9. The material may be organosilicate glass and is deposited by chemical vapor deposition(CVD).

Now, the surface of the low-k material layer 18 is treated with a helium plasma 20. Helium is flowed about between about 50 and 9000 sccm at a temperature of between about 250 and 450° C., at a pressure of between about 2 and 8 Torr. HFRF power is preferably 200 to 600 watts with a spacing of 200 to 600 mls. The helium plasma treatment continues for between about 2 and 40 seconds.

Figure 2:
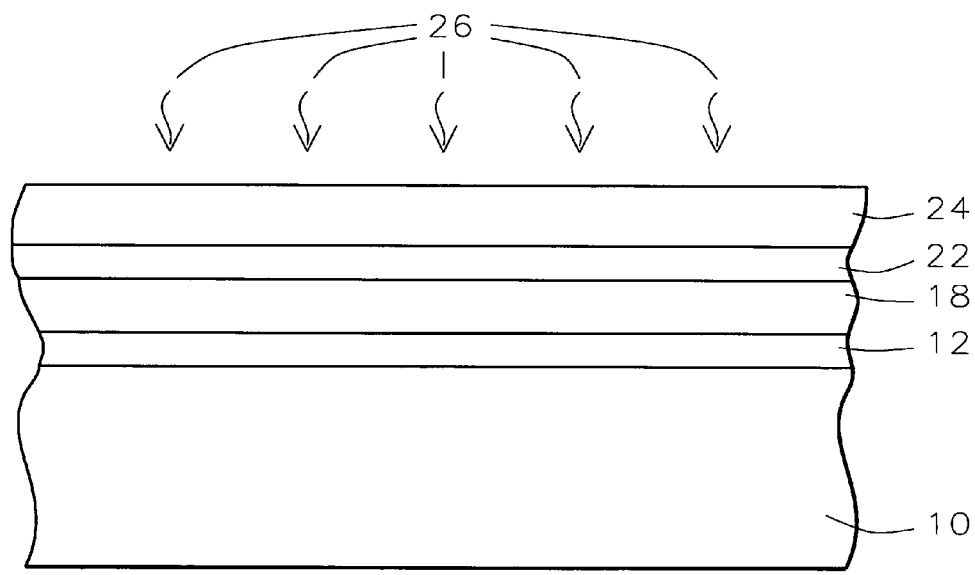

The helium treatment of the invention improves the adhesion property of the low-k film 18. Now, another layer is deposited overlying the treated low-k layer 18. For example, a second barrier layer 22 may be deposited over the low-k film 18 to a thickness of between about 250 and 600 Angstroms, as shown in FIG. 2. This barrier layer 22 may be silicon carbide. A second low-k layer 24 may be deposited by CVD over the barrier layer to a thickness of between about 1000 and 8000 Angstroms. The second low-k layer 24 is treated with helium plasma 26 in the same way as was the first low-k layer 18 in order to promote adhesion with an overlying layer.

Figure 3:
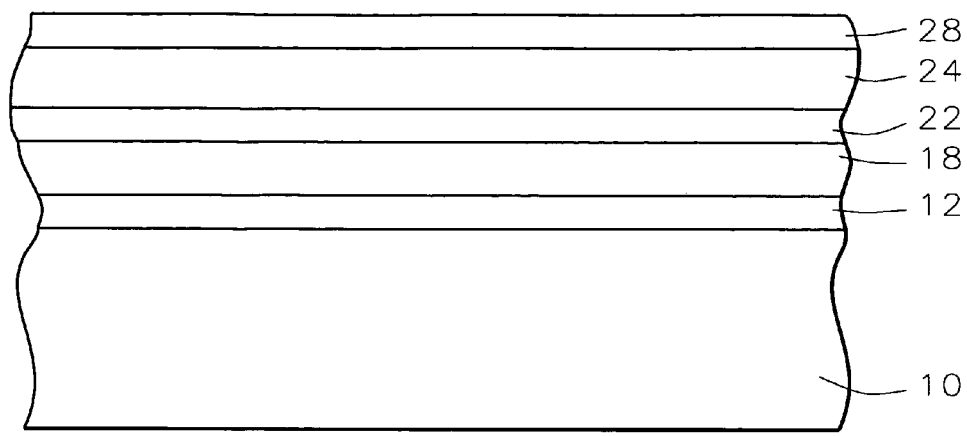

Referring now to FIG. 3, a capping layer 28 is deposited over the treated surface of the second low-k layer. For example, the capping layer may be silicon carbide, silicon nitride, or silicon dioxide. The helium plasma treatment promotes adhesion between the low-k layer 24 and the capping layer 28.

Figure 4:
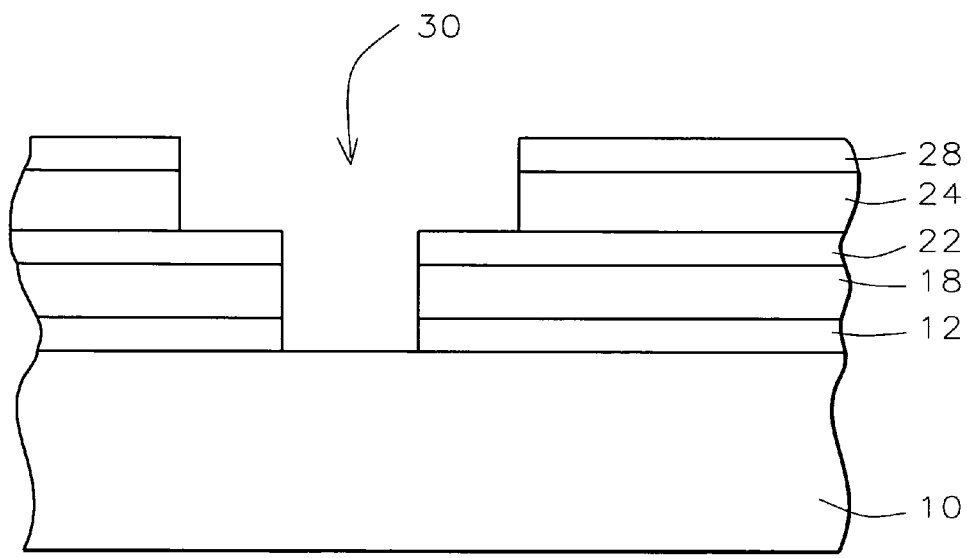
Figure 5:
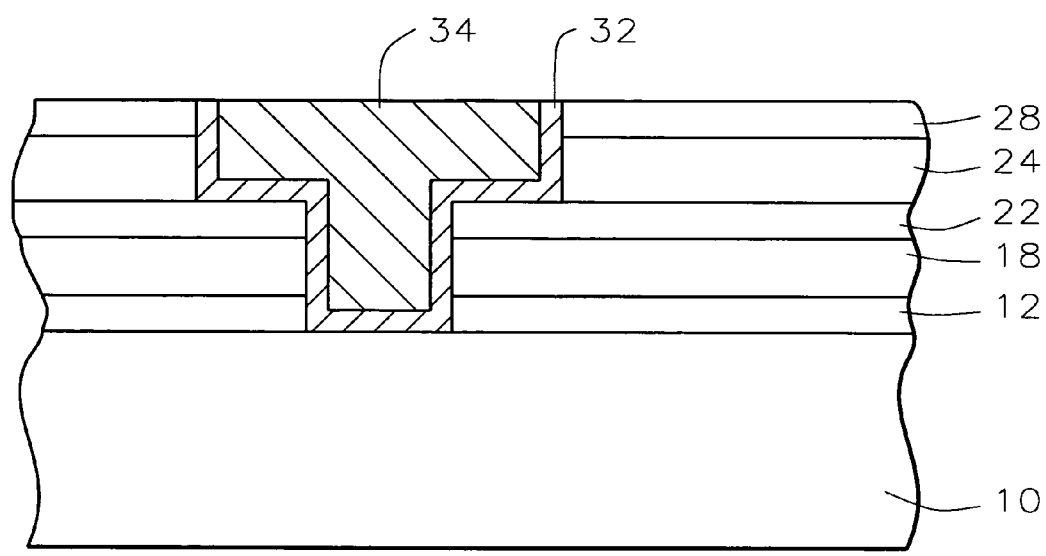

Processing continues as is conventional in the art to pattern and etch the low-k layers as shown in FIG. 4. For example, dual damascene opening 30 is etched through the first and second low-k layers 18 and 24, the capping layer 28, and the passivation/barrier layers 12 and 22, using one of the various schemes such as trench-first, via-first, or embedded via. Referring to FIG. 5, the dual damascene opening is then filled with a barrier metal layer 32 and a copper layer 34, for example, by any of the conventional means, including physical or chemical vapor deposition and etchback or polishing or electroless plating, and so on.

It will be understood by those skilled in the art that the process of the present invention is not limited to the dual damascene process illustrated in the drawings, but can be applied to any process where it is desired to improve adhesion of a low-k layer to overlying layers. The helium plasma treatment process of the present invention can be used in the presence of a barrier layer between low-k layers, in the presence of a capping layer, or in the presence of both a barrier layer and a capping layer.

The process of the present invention has been implemented and tested using an advanced four point bending method to measure the low-k interface critical fracture energy: Gc, $J/m^2$. It has been found that the dielectric constant of the low-k dielectric material is unchanged after the helium plasma treatment. Furthermore, the critical fracture energy Gc is improved by the helium plasma treatment. The following Table 1 shows Gc values at an interface between the low-k material and a silicon dioxide layer (a) and between the low-k material and a silicon carbide layer (b) with and without the helium plasma treatment of the invention.

TABLE 1

|  | W/o He | With He |
|---|---|---|
| a) Low-k/$SiO_2$ interface | 3.6 | 9.3 |
| b) Low-k/SiC interface | 6.7 | 10.7 |

These results show that the physical interface interlocking property of the layers has been improved significantly.

Table 2 shows the roughness and the Gc values at the interface of the low-k material and a silicon carbide layer with and without the Helium plasma treatment of the present invention.

TABLE 2

|  | W/o He | With He |
|---|---|---|
| Roughness (nm) | 0.533 | 0.605 |
| Gc | 6.7 | 10.7 |

The table above shows a 60% improvement in adhesion with the process of the present invention.

While the invention has been particularly shown and described with reference to the preferred embodiments thereof, it will be understood by those skilled in the art that various changes in form and details may be made without departing from the spirit and scope of the invention.

What is claimed is:

1. A method of forming a dielectric material layer comprising:
   depositing a low dielectric constant material layer on a substrate;
   treating said low dielectric constant material layer with helium plasma comprising flowing helium at between about 50 and 9000 sccm at a temperature of between about 250 and 450° C., at a pressure of between about 2 and 8 Torr, at HFRF power of between about 100 and 600 watts for between about 2 and 40 seconds; and
   thereafter depositing an overlying layer on said low dielectric constant material layer wherein there is good adhesion between said low dielectric constant material layer and said overlying layer.

2. The method according to claim 1 wherein said overlying layer comprises silicon dioxide or silicon carbide.

3. An interconnection method in the fabrication of an integrated circuit device comprising:
   depositing a low dielectric constant material layer over a substrate;
   treating said low dielectric constant material layer with helium plasma comprising flowing helium at between about 50 and 9000 sccm at a temperature of between about 250 and 450° C., at a pressure of between about 2 and 8 Torr, at HFRF power of between about 100 and 600 watts for between about 2 and 40 seconds;
   thereafter depositing a capping layer overlying said low dielectric constant material layer wherein there is good adhesion between said low dielectric constant material layer and said capping layer;
   etching an opening through said capping layer and said low dielectric constant material layer to said substrate; and
   filling said opening with a conducting layer to complete said interconnection in the fabrication of said integrated circuit device.

4. The method according to claim 3 wherein said capping layer comprises silicon carbide, silicon nitride, or silicon dioxide.

5. An interconnection method in the fabrication of an integrated circuit device comprising:
   depositing a passivation layer on a substrate;
   depositing a low dielectric constant material layer overlying said passivation layer;
   treating said low dielectric constant material layer with helium plasma comprises flowing helium at between about 50 and 9000 sccm at a temperature of between about 250 and 450° C., at a pressure of between about 2 and 8 Torr, at HFRF power of between about 100 and 600 watts for between about 2 and 40 seconds;
   thereafter depositing a capping layer overlying said low dielectric constant material layer wherein there is good adhesion between said low dielectric constant material layer and said barrier layer;
   etching an opening through said capping layer, said low dielectric constant layer and said passivation layer to said substrate; and
   filling said opening with a conducting layer to complete said interconnection in the fabrication of said integrated circuit device.

6. The method according to claim 5 wherein said capping layer comprises silicon carbide, silicon nitride, or silicon dioxide.

7. The method according to claim 5 wherein said low dielectric constant material is a first low dielectric constant material and further comprising after said step of treating said first low dielectric constant material with helium plasma:
   depositing a barrier layer overlying said first low dielectric constant material layer wherein there is good adhesion between said first low dielectric constant material layer and said barrier layer;
   depositing a second low dielectric constant material layer overlying said barrier layer;
   treating said second low dielectric constant material layer with helium plasma; and
   thereafter depositing said capping layer overlying said second low dielectric constant material.

8. The method according to claim 5 wherein said second low dielectric constant material has a dielectric constant of less than 3.1.

9. The method according to claim 5 wherein said second low dielectric constant material is an organosilicate glass.

10. The method according to claim 5 wherein said step of treating said second low dielectric constant material layer with helium plasma comprises flowing helium at between about 50 and 9000 sccm at a temperature of between about 250 and 450° C., at a pressure of between about 2 and 8 Torr, at HFRF power of between about 100 and 600 watts for between about 2 and 40 seconds.

11. The method according to claim 5 wherein said barrier layer comprises silicon carbide or silicon dioxide.

12. The method according to claim 1 wherein said low dielectric constant material has a dielectric constant of less than 3.1.

13. The method according to claim 1 wherein said low dielectric constant material is an organosilicate glass.

14. The method according to claim 1 wherein said low dielectric constant material is an organosilicate glass having a dielectric constant of 2.9.

15. The method according to claim 3 further comprising forming semiconductor device structures in and on said substrate wherein said opening is made to one of said semiconductor device structures.

16. The method according to claim 3 wherein said low dielectric constant material has a dielectric constant of less than 3.1.

17. The method according to claim 3 wherein said low dielectric constant material is an organosilicate glass.

18. The method according to claim 3 wherein said low dielectric constant material is an organosilicate glass having a dielectric constant of 2.9.

19. The method according to claim 5 further comprising forming semiconductor device structures in and on said substrate wherein said opening is made to one of said semiconductor device structures.

20. The method according to claim 5 wherein said low dielectric constant material has a dielectric constant of less than 3.1.

21. The method according to claim 5 wherein said low dielectric constant material is an organosilicate glass.

22. The method according to claim 5 wherein said low dielectric constant material is an organosilicate glass having a dielectric constant of 2.9.

* * * * *